United States Patent
Kamata et al.

(10) Patent No.: US 7,183,880 B2
(45) Date of Patent: Feb. 27, 2007

(54) DISCRETE INDUCTOR BANK AND LC FILTER

(75) Inventors: Takatsugu Kamata, Yokohama (JP); Kazunori Okui, San Jose, CA (US)

(73) Assignee: RfStream Corporation, Osaka (JP)

( * ) Notice: Subject to any disclaimer, the term of this patent is extended or adjusted under 35 U.S.C. 154(b) by 0 days.

(21) Appl. No.: 11/246,475

(22) Filed: Oct. 7, 2005

(65) Prior Publication Data

US 2006/0028301 A1    Feb. 9, 2006

Related U.S. Application Data

(63) Continuation of application No. 11/196,234, filed on Aug. 2, 2005, which is a continuation of application No. 10/622,371, filed on Jul. 18, 2003, now Pat. No. 6,940,365.

(51) Int. Cl.
*H03H 7/00* (2006.01)

(52) U.S. Cl. .................. 333/174; 333/172; 333/173; 333/175

(58) Field of Classification Search ............... 333/174, 333/17.1, 24 C, 175, 178, 205, 207, 235, 333/172, 173; 455/286, 178.1, 180.4, 195.1; 331/16, 117 R; 334/15, 78; 361/298.5; 348/731

See application file for complete search history.

(56) References Cited

U.S. PATENT DOCUMENTS

| | | | |
|---|---|---|---|
| 1,735,742 A | 11/1929 | Fetter | |
| 2,140,770 A | 12/1938 | Schofield | |
| 2,325,174 A | 7/1943 | Cooper | |

(Continued)

FOREIGN PATENT DOCUMENTS

EP    0392449 B1    10/1990

(Continued)

OTHER PUBLICATIONS

U.S. Appl. No. 11/373,743, filed Mar. 10, 2006 Kamata et al.
U.S. Appl. No. 11/372,602, filed Mar. 10, 2006, Kamata et al.

*Primary Examiner*—Linh V. Nguyen
(74) *Attorney, Agent, or Firm*—Stattler Johansen & Adeli LLP

(57) ABSTRACT

A discrete inductive-capacitive (LC) filter selects between at least two inductor banks to tune the LC filter. The filter receives an input signal that includes one or more bands of frequencies. A control signal selects a band of frequencies for processing. A first inductor bank is selected to filter a first band of frequencies, and a second inductor bank is selected to filter a second band of frequencies. A switch circuit couples the input signal to either the first inductor bank or the second inductor bank. The switch circuit selects the first inductor bank if the first band of frequencies is selected, and selects the second inductor bank if the second band of frequencies is selected. The switch circuit electrically isolates the switching of the input signal to the first and the second inductor banks, so as to enhance the Q factor of the LC filter. Circuit and techniques are disclosed to reduce parasitic capacitance in a capacitive bank that employs MOS transistors. Furthermore, circuits and techniques are disclosed to tune a coupling factor on an inductive bank based on the frequency of the input signal.

21 Claims, 7 Drawing Sheets

U.S. PATENT DOCUMENTS

| | | | |
|---|---|---|---|
| 2,464,557 A | 3/1949 | Crockett | |
| 2,496,177 A | 1/1950 | Richards et al. | |
| 2,531,312 A | 11/1950 | Loon | |
| 2,549,789 A | 4/1951 | Ferrill, Jr. | |
| 2,796,524 A | 6/1957 | Ferrill, Jr. | |
| 2,801,341 A | 7/1957 | Jaffe | |
| 2,912,656 A * | 11/1959 | Waring | 333/178 |
| 2,997,672 A * | 8/1961 | Reinsmith | 333/24 C |
| 3,252,096 A | 5/1966 | Carlson | |
| 3,400,345 A | 9/1968 | Oloff | |
| 3,488,595 A | 1/1970 | Vasile | |
| 3,509,500 A | 4/1970 | McNair et al. | |
| 3,544,903 A | 12/1970 | Sakamoto | |
| 3,628,152 A * | 12/1971 | Carlson | 455/195.1 |
| 3,643,168 A * | 2/1972 | Manicki | 455/178.1 |
| 3,662,271 A * | 5/1972 | Nakanishi | 455/180.4 |
| 3,686,575 A | 8/1972 | Chamberlain | |
| 3,702,958 A * | 11/1972 | Reynolds | 361/298.5 |
| 3,794,941 A | 2/1974 | Templin | |
| 3,931,578 A | 1/1976 | Gittinger | |
| 4,112,378 A | 9/1978 | Ito et al. | |
| 4,118,679 A | 10/1978 | Hiday et al. | |
| 4,138,653 A * | 2/1979 | Midgley | 334/15 |
| 4,138,654 A | 2/1979 | Luhowy | |
| 4,287,602 A * | 9/1981 | Kessler | 455/286 |
| 4,296,391 A | 10/1981 | Hazama et al. | |
| 4,330,794 A | 5/1982 | Sherwood | |
| 4,379,271 A | 4/1983 | Lehmann | |
| 4,456,895 A | 6/1984 | Landt et al. | |
| 4,514,763 A | 4/1985 | Rindal | |
| 4,555,809 A | 11/1985 | Carlson | |
| 4,598,423 A | 7/1986 | Hettiger | |
| 4,785,253 A | 11/1988 | Hughes | |
| 4,789,897 A | 12/1988 | Kappeler et al. | |
| 4,812,851 A | 3/1989 | Giubardo | |
| 4,818,903 A | 4/1989 | Kawano | |
| 4,882,614 A | 11/1989 | Kageyama et al. | |
| 4,970,479 A | 11/1990 | Landt et al. | |
| 4,985,769 A | 1/1991 | Yasumoto et al. | |
| 4,988,902 A | 1/1991 | Dingwall | |
| 5,077,542 A | 12/1991 | Lanoiselee | |
| 5,122,868 A | 6/1992 | Isnardi | |
| 5,146,337 A | 9/1992 | Grubbs | |
| 5,146,338 A | 9/1992 | Lehmann et al. | |
| 5,148,280 A | 9/1992 | Wignot et al. | |
| 5,155,580 A | 10/1992 | Gibson et al. | |
| 5,187,445 A | 2/1993 | Jackson | |
| 5,264,937 A | 11/1993 | Christopher | |
| 5,287,180 A | 2/1994 | White | |
| 5,386,239 A | 1/1995 | Wang et al. | |
| 5,491,715 A | 2/1996 | Flaxl | |
| 5,519,265 A | 5/1996 | Latham | |
| 5,525,940 A | 6/1996 | Heikkila et al. | |
| 5,663,773 A | 9/1997 | Goeckler | |
| 5,737,035 A | 4/1998 | Rotzoll | |
| 5,898,900 A | 4/1999 | Richter et al. | |
| 5,905,398 A | 5/1999 | Todsen et al. | |
| 5,914,633 A | 6/1999 | Comino et al. | |
| 5,917,387 A * | 6/1999 | Rice et al. | 333/174 |
| 5,956,098 A | 9/1999 | Mizukami | |
| 6,016,170 A | 1/2000 | Takayama et al. | |
| 6,094,236 A | 7/2000 | Abe et al. | |
| 6,104,442 A | 8/2000 | Patel et al. | |
| 6,169,569 B1 | 1/2001 | Widmer et al. | |
| 6,177,964 B1 | 1/2001 | Birleson | |
| 6,219,376 B1 | 4/2001 | Zhodzishsky et al. | |
| 6,226,509 B1 | 5/2001 | Mole et al. | |
| 6,243,567 B1 | 6/2001 | Saito | |
| 6,256,495 B1 | 7/2001 | Francisco et al. | |
| 6,275,113 B1 | 8/2001 | Nakano et al. | |
| 6,307,443 B1 | 10/2001 | Gabara | |
| 6,324,233 B1 | 11/2001 | Sempel et al. | |
| 6,351,293 B1 | 2/2002 | Perlow | |
| 6,359,940 B1 | 3/2002 | Ciccarelli et al. | |
| 6,377,315 B1 | 4/2002 | Carr et al. | |
| 6,424,206 B2 | 7/2002 | Takahashi et al. | |
| 6,424,209 B1 | 7/2002 | Gorecki et al. | |
| 6,470,055 B1 | 10/2002 | Feher | |
| 6,535,075 B2 | 3/2003 | Frech et al. | |
| 6,535,722 B1 | 3/2003 | Rosen et al. | |
| 6,538,521 B2 | 3/2003 | Kobayashi et al. | |
| 6,593,828 B1 | 7/2003 | Helfenstein et al. | |
| 6,597,748 B1 | 7/2003 | Hietala et al. | |
| 6,628,728 B1 | 9/2003 | McCarty, Jr. | |
| 6,631,256 B2 | 10/2003 | Suominen | |
| 6,636,085 B2 | 10/2003 | Okazaki et al. | |
| 6,657,678 B1 | 12/2003 | Mizukami et al. | |
| 6,667,649 B1 | 12/2003 | Lee | |
| 6,667,760 B1 | 12/2003 | Limberg | |
| 6,680,971 B1 | 1/2004 | Tazebay et al. | |
| 6,686,817 B2 | 2/2004 | Zhu et al. | |
| 6,725,463 B1 | 4/2004 | Birleson | |
| 6,750,734 B2 * | 6/2004 | Utsunomiya et al. | 333/17.1 |
| 6,760,575 B2 * | 7/2004 | Welland | 455/260 |
| 6,778,022 B1 | 8/2004 | Zhang et al. | |
| 6,778,023 B2 * | 8/2004 | Christensen | 331/16 |
| 6,778,594 B1 | 8/2004 | Liu | |
| 6,784,766 B2 * | 8/2004 | Allison et al. | 333/205 |
| 6,882,245 B2 * | 4/2005 | Utsunomiya et al. | 333/174 |
| 6,940,358 B1 * | 9/2005 | Meacham | 331/117 R |
| 6,940,365 B2 * | 9/2005 | Kamata et al. | 333/175 |
| 6,954,115 B2 | 10/2005 | Wong | |
| 6,965,761 B2 * | 11/2005 | Welland et al. | 455/262 |
| 2002/0047942 A1 | 4/2002 | Vorenkamp | |
| 2002/0186099 A1 | 12/2002 | Sengupta | |
| 2003/0050861 A1 | 3/2003 | Martin et al. | |
| 2003/0053562 A1 | 3/2003 | Busson et al. | |
| 2003/0097601 A1 | 5/2003 | Glas et al. | |
| 2003/0132455 A1 | 7/2003 | Utsunomiya et al. | |
| 2003/0186671 A1 | 10/2003 | Prodanov et al. | |
| 2003/0197810 A1 | 10/2003 | Jaffe | |
| 2003/0223017 A1 | 12/2003 | Utsunomiya et al. | |
| 2004/0095513 A1 | 5/2004 | Kamata et al. | |
| 2004/0198289 A1 | 10/2004 | Ashkenazi | |
| 2004/0198298 A1 * | 10/2004 | Waight et al. | 455/333 |
| 2005/0143039 A1 | 6/2005 | Kamata et al. | |
| 2005/0148312 A1 * | 7/2005 | Toncich et al. | 455/339 |
| 2006/0028301 A1 | 2/2006 | Kamata et al. | |

FOREIGN PATENT DOCUMENTS

| | | |
|---|---|---|
| EP | 0676880 | 10/1995 |
| EP | 0707379 A1 | 4/1996 |
| JP | 11122067 A2 | 4/1999 |
| JP | 11122068 A2 | 4/1999 |
| WO | WO 9522839 | 8/1995 |
| WO | WO 9639778 | 12/1996 |
| WO | WO 0106637 A1 | 1/2001 |
| WO | WO 0128310 | 4/2001 |

* cited by examiner

DISCRETE INDUCTOR BANK AND LC FILTER

CROSS REFERENCE TO RELATED APPLICATIONS

This application is a continuation application of United States Patent Application entitled "METHOD AND APPARATUS FOR AN IMPROVED DISCRETE LC FILTER", having Ser. No. 11/196,234 filed on Aug. 2, 2005, now U.S. Pat. No. 7,088,202 which is a continuation application of United States Patent Application entitled "METHOD AND APPARATUS FOR AN IMPROVED DISCRETE LC FILTER", having Ser. No. 10/622,371, filed on Jul. 18, 2003, now U.S. Pat. No. 6,940,365.

BACKGROUND OF THE INVENTION

1. Field of the Invention

The present invention is directed toward the field of discrete filters, and more particularly toward capacitor and/or inductor bank filters.

2. Art Background

Inductor and capacitor banks may be configured to implement many different types of discrete filters. FIG. 1a illustrates one embodiment for an inductive (L) bank. For this embodiment, the inductive bank includes five inductors (110, 108, 106, 104 and 102). Although inductive bank 100 includes five inductors, any number of inductors may be used without deviating from the spirit or scope of the invention. The number and values for the inductors are a function of the desired frequency response characteristics of the filter. The inductors, which form inductive bank 100, are configured in parallel. Each inductor is added to the L bank through a corresponding switch as shown in FIG. 1a. Typically, the switches are implemented using metal oxide semiconductor ("MOS") transistors.

FIG. 1b illustrates one embodiment for a capacitive bank. For this example, capacitive bank 120 contains five capacitors (130, 128, 126, 124 and 122). A different number of capacitors and different capacitive values may be selected to implement different frequency responses. Also, as shown in FIG. 1b, capacitors 128, 126, 124 and 122 are selected for the C bank through a respective switch. Typically, these switches are implemented with MOS transistors.

Each MOS switching transistor introduces a resistive component into the filter response. Thus, each capacitor selected in the C bank increases the series resistance. The increase in series resistance, or decrease in parallel resistance, decreases the Q factor, which, in turn, degrades performance of the filter bank.

Accordingly, it is desirable to improve the characteristics and performance of an LC filter by reducing parasitic capacitance and increasing the Q factor.

SUMMARY OF THE INVENTION

A discrete inductive-capacitive (LC) filter selects between at least two inductor banks to tune the LC filter for one or more bands of frequencies. The filter receives an input signal for processing. The input signal includes one or more bands of frequencies. A control signal selects a band of frequencies for processing. A first inductor bank, which comprises at least one inductor, is selected to filter a first band of frequencies, and a second inductor bank, which also comprises at least one inductor, is selected to filter a second band of frequencies. A switch circuit couples the input signal to either the first inductor bank or the second inductor bank. The switch circuit selects the first inductor bank if the first band of frequencies is selected, and selects the second inductor bank if the second band of frequencies is selected. The switch circuit electrically isolates the switching of the input signal to the first and the second inductor banks, so as to enhance the Q factor of the LC filter.

DETAILED DESCRIPTION

Figure 1A:
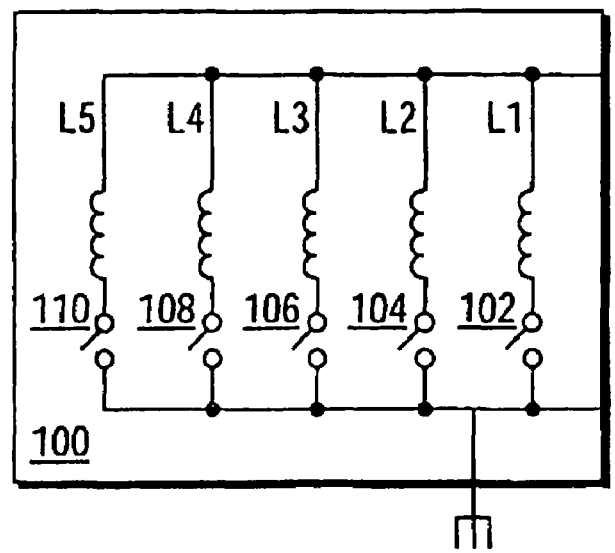
FIG. 1a illustrates one embodiment for an inductive (L) bank.
Figure 1B:
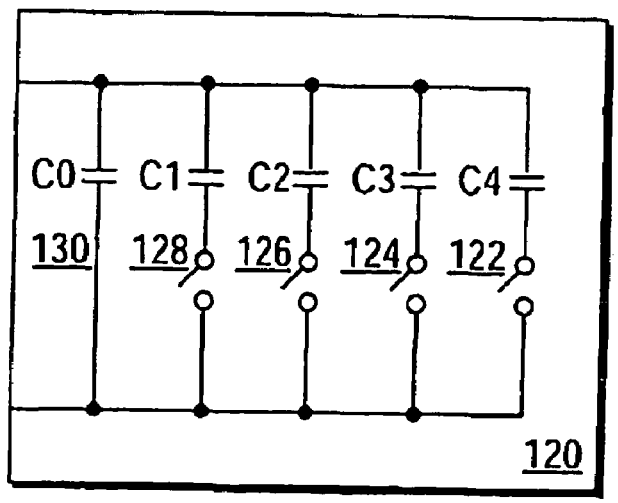
FIG. 1b illustrates one embodiment for a capacitive bank.
Figure 2:
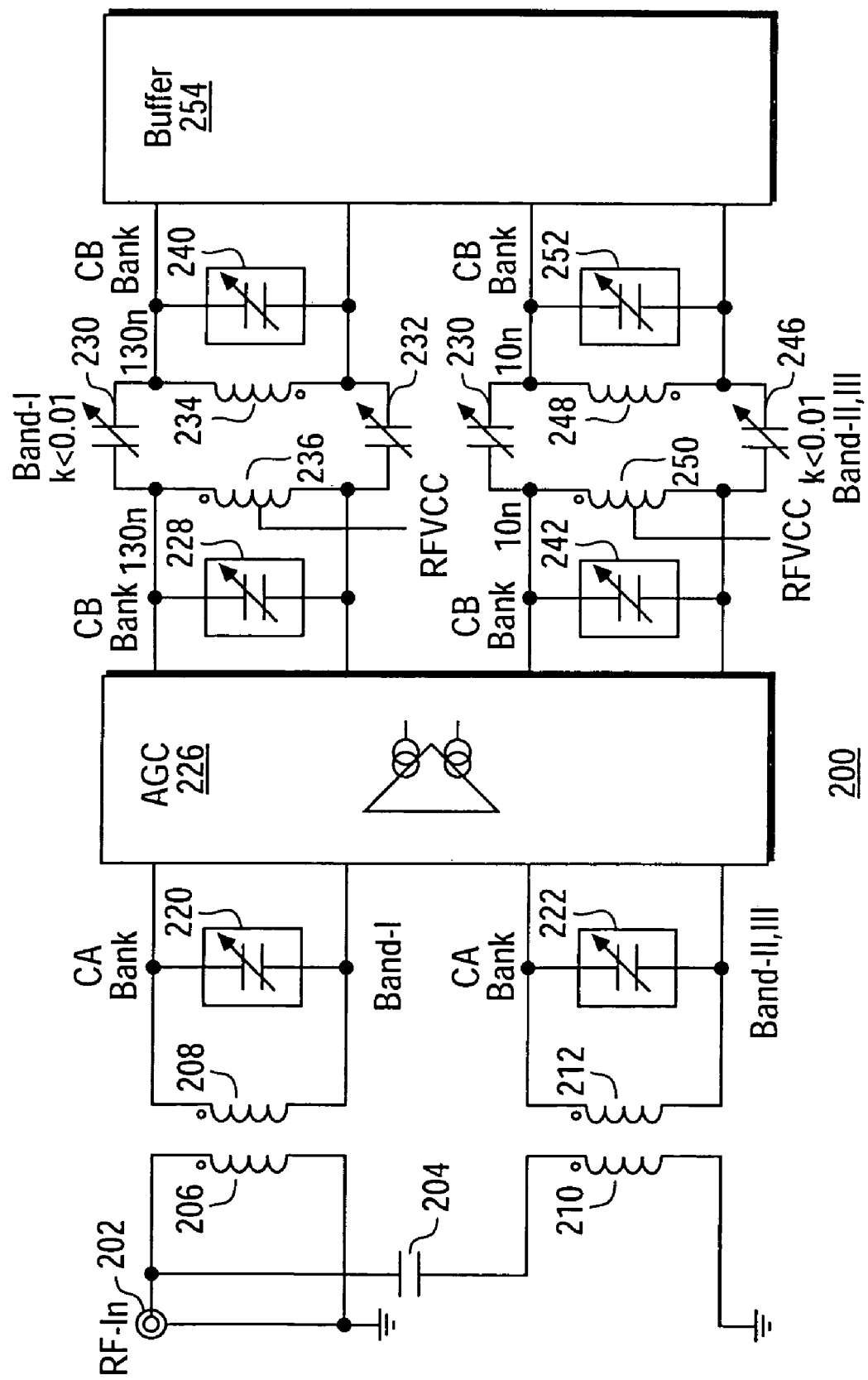
FIG. 2 is a block diagram illustrating one embodiment for implementing LC filters.

FIG. 2 is a block diagram illustrating one embodiment for implementing LC filters. Circuit 200 includes two signal paths: a signal path for a first band (e.g., Band I), and a signal path for a second band (e.g., Band II, III). In one application, circuit 200 comprises LC filter banks for a television tuner. For the television tuner embodiment, the signal path for "Band I" filters input signals within the frequency range of 50 to 285 MHz, and the signal path for "Band II, III" filters input signals within the frequency range of 285 to 880 MHz.

The signal path for the first band consists of an inductor bank (i.e., transformer) comprising inductors 206 and 208. The inductive bank (inductors 206 and 208) receives the input signal from radio frequency ("RF") input 202. Circuit 200 further includes, in the first signal path, capacitor bank 220. Capacitor bank 220 comprises a plurality of capacitors selectively coupled to the first signal path. The selective coupling of capacitors in capacitor bank 220 along with inductors 206 and 208 comprise a first tunable LC filter. The output of capacitor bank 220 is input to an amplifier (e.g., automatic gain controlled) 226.

The RF input 202 is also coupled to the second signal path, through capacitor 204, for the second bank of input frequencies (e.g., Bands II, III). The second signal path for the second band consists of an inductor bank, consisting of inductors 210 and 212, and a capacitor bank 222. Capacitor bank 222 comprises a plurality of capacitors selectively coupled to filter the signal in the second signal path. The capacitors of capacitor bank 220 and inductors 210 and 212 comprise a first tunable LC filter for the second signal path. The output of capacitor bank 220 is input to AGC amplifier 226.

The AGC amplifier 226 selectively couples either the first signal path or the second signal path to the output of amplifier 226. For example, in the television tuner embodiment, AGC amplifier 226 selects the first signal path if the television tuner is set to tune a channel in Band I. Alternatively, AGC amplifier 226 selects the second signal path if the television tuner is set to tune a channel in Bands II, III. One embodiment for AGC amplifier 226 is described more fully below in conjunction with a discussion of FIGS. 3 and 4.

For the first signal path, the output of AGC amplifier 226 is coupled to capacitor bank 228. The output of capacitor bank 228 is input to an inductor bank. In turn, the output of the inductor bank is input to capacitor bank 240. For this embodiment, the inductor bank comprises inductors 234 and 236, and tunable capacitors 230 and 232. The capacitors of capacitor banks 228 and 240, similar to capacitor bank 220, are selected to tune the LC filter. The output of the first signal path is input to buffer 254.

For the second signal path, the output of AGC amplifier 226 is coupled to capacitor bank 242. Similar to the first signal path, the output of capacitor bank 242 is input to an inductor bank (i.e., inductors 248, 250 and tunable capacitors 230 and 246). The output of the inductor bank is input to capacitor bank 252. The capacitors of capacitor banks 228 and 240 are selected to tune or program the LC filter. The output of the second signal path is also input to amplifier 254.

The inductors, for the embodiment of FIG. 2, do not include switches (e.g., MOS transistors), coupled in series with the inductors, for selectively adding inductance to an LC filter. Instead, the input signal (i.e., the signal for processing) is switched in an amplifier between signal paths (e.g., the first and second signal paths for the embodiment of FIG. 2). The elimination of the series resistance in the inductor bank results in a better Q factor for the LC filter. The amplifier, which switches between the first and second signal paths, isolates the resistance from the MOS transistors. Although the embodiment of FIG. 2 isolates the switches in the input and output transistor stages, any configuration to isolate the series resistance of an electronic switch from inductors may be used without deviating from the spirit or scope of the invention.

The LC filter architecture of FIG. 2 minimizes the number of coils. The first and second signal paths are suitable for covering a wide range of input frequencies. For example, in the embodiment of FIG. 2, only two coils are used for both the first and second signal paths. This architecture has application for use in processing UHF/VHF bands of television signals.

Figure 3:
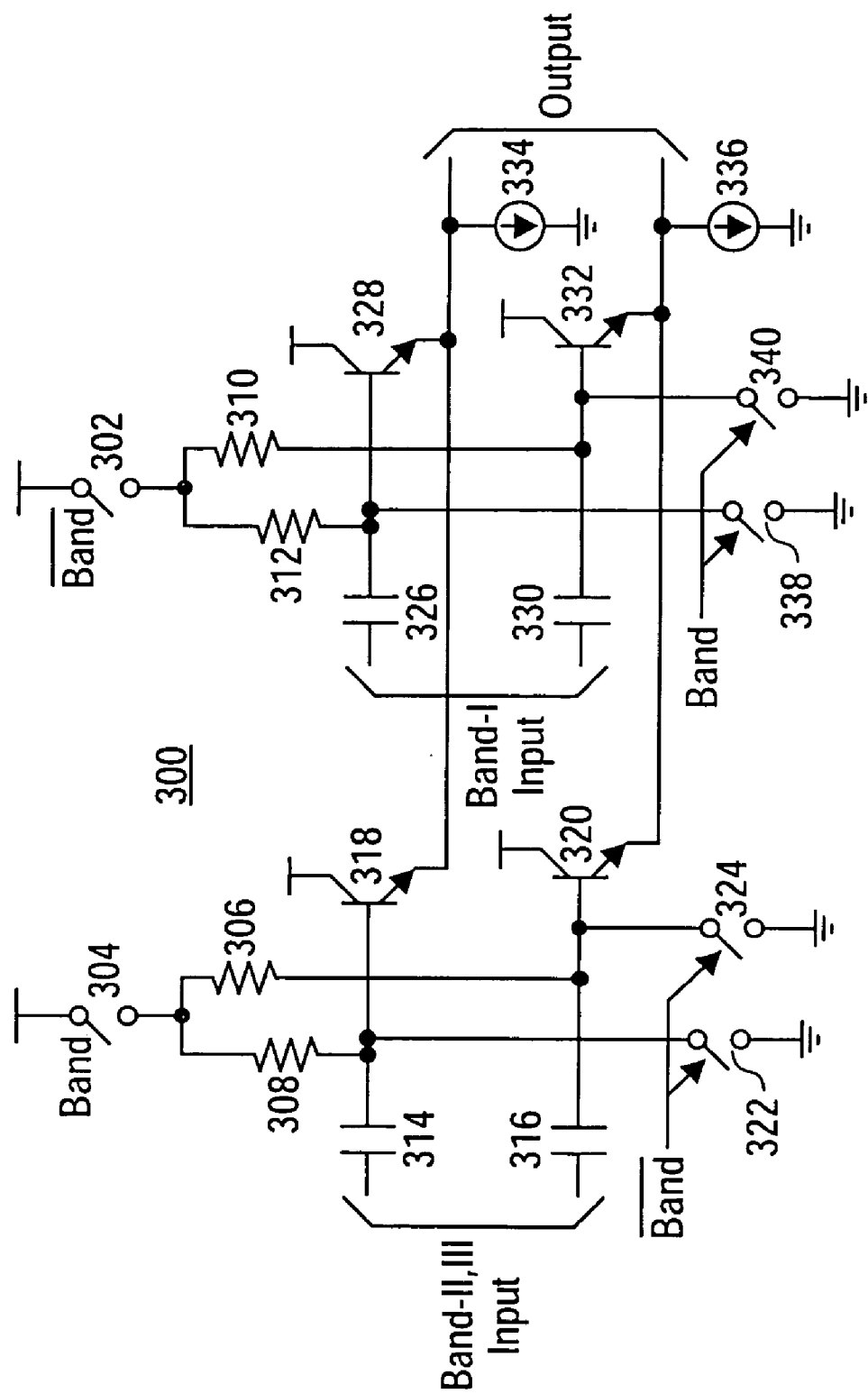
FIG. 3 illustrates one embodiment for an input stage of an amplifier.
Figure 4:
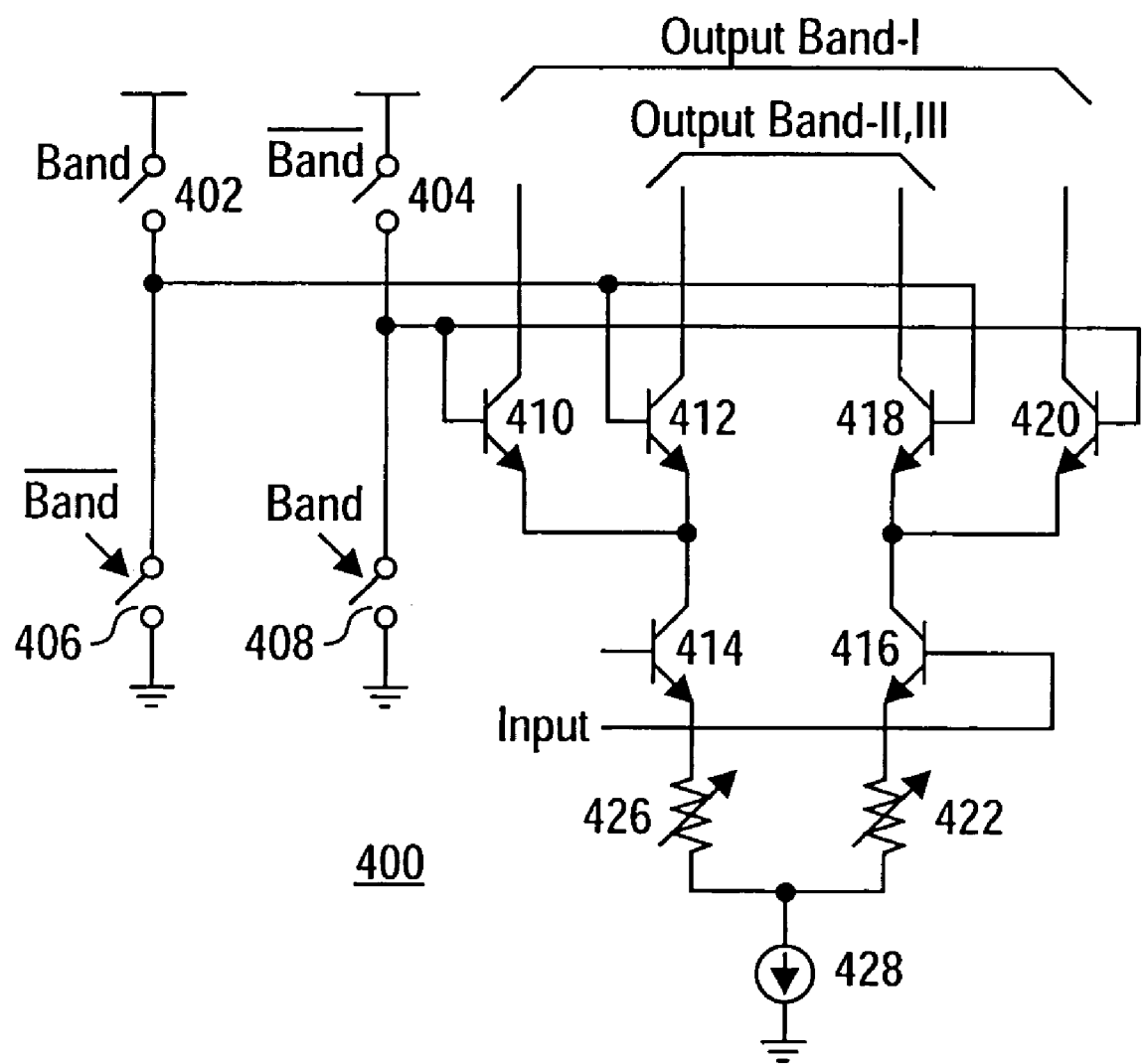
FIG. 4 illustrates one embodiment for an output stage an amplifier that selects between inductor banks.

FIGS. 3 and 4 illustrate one embodiment for input and output stages, respectively, of an amplifier. The amplifier switches between signal paths to effectively select inductor banks for an input signal. In general, the amplifier receives, as input, signals from the first and second signal paths as well as control signals (band and band'). For the first signal path (e.g., signal path for Band I), transistors 328 and 332, when selected, drive the output for this transistor stage. If the second signal path is selected (e.g., signal path for Band II, III), transistors 318 and 320 drive the output for this transistor stage. The differential input signal path includes, for the first signal path, capacitors 326 and 330, and transistors 318 and 320. The second signal path receives a differential signal for input to capacitors 314 and 316.

The control signal, Band, controls the switching of switch 304, for the first signal path, and controls the switching of switches 338 and 340 in the second signal path. The control signal, Band', has a value opposite from the control signal Band. The control signal Band' controls, for the first signal path, the switching of switch 302, and controls the switching of switches 322 and 324 in the second signal path. In one embodiment, the switches (302, 304, 322, 324, 338 and 340) comprise metal oxide semiconductor (MOS) transistors. In operation, to select the first signal path (e.g., Band I), Band is set to a low logic level and Band' is set to a high logic level. Under these control signals, switch 302 is turned on, and switches 338 and 340 are turned off. The activation of switch 302 biases the output transistors (328 and 332) to conduct. As a result, the input signal is conducted through transistors 328 and 332. Also, a low logic level signal on Band turns off switch 304, and a high logic level on Band' turns on switches 322 and 324. When closed, switches 322 and 324 pull the bases of transistors 318 and 320 to ground, and the input signal to the second signal path is not passed to the output of the input transistor stage (300).

Conversely, when Band is set to a high logic level and Band' is set to a low logic level, switch 302 is opened and switches 338 and 340 are closed. Under these control signals, the voltage level at the bases of transistors 332 and 328 are pulled to ground, thus turning off transistors 328 and 332. As a result, the input signal from the first signal path is not passed to the output of the input transistor stage (300). Also, a high logic level on Band and a low logic level on Band', closes switch 304 and opens switches 322 and 324. The activation of switch 304 biases the output transistors, 318 and 320, through pull-up of resistors 308 and 306, to conduct. As a result, the input signal to the second signal path is passed to the output of the input transistor stage (300). Each of the output lines of this transistor stage includes a current buffer, illustrated on FIG. 3 as current sources 334 and 336.

FIG. 4 illustrates one embodiment for an output stage an amplifier that selects between inductor banks. The amplifier isolates the switching of transistors and consequently isolates transistor series resistance to the inductor banks. In one embodiment, the output stage of the amplifier comprises a transconductance ($g_m$) amplifier. For this embodiment, the transconductance amplifier, which converts a voltage to a current, comprises transistors 410, 412, 414, 416, 418 and 420, as well as variable resistors 422 and 426 and current source 428. To select the first signal path (e.g., Band I), the Band control signal is set to a low logic level, and the Band' control signal is set to a high logic level. A high logic level Band' control signal turns on transistor 404 to place a high logic level at the base of transistors 410 and 412. Consequently, transistors 410 and 420 drive the output for Band I or the first signal path. Also, a high logic level on Band' closes switch 406, pulling the bases of transistors 412 and 418 to ground. As a result, transistors 412 and 418 are turned off, and the input does not pass to the second signal path (Band II, III).

Alternatively, to select the second signal path (Bands II, III), the Band control signal is set to a high logic level, and the Band' control signal is set to a low logic level. A high logic level Band' control signal turns on transistor 404 to place a high logic level at the base of transistors 410 and 412. As a result, transistors 412 and 418 drive the output for the second signal path (Band II, III). Also, a low logic level on Band' closes switch 408, pulling the bases of transistors 410 and 420 to ground and turning the transistors off (i.e., the input does not pass to the first signal path (Band I) to the output).

Figure 5A:
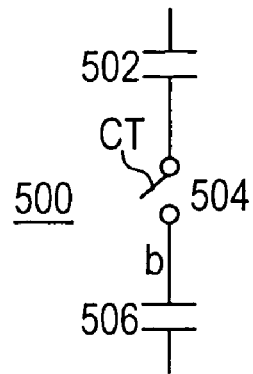
FIG. 5A illustrates one embodiment for electrically coupling capacitors.

FIG. 5A illustrates one embodiment for electrically coupling capacitors. In general, one or more capacitors selectively couple a plurality of capacitors to form a configurable capacitor bank. For the example circuit 500 of FIG. 5A, capacitors 502 and 506 are coupled through a switch 504. In one embodiment, switch 504 comprises a metal oxide semiconductor (MOS) transistor. A control signal (CT) enables switch 504 so as to electrically connect capacitors 502 and 506.

Figure 5B:
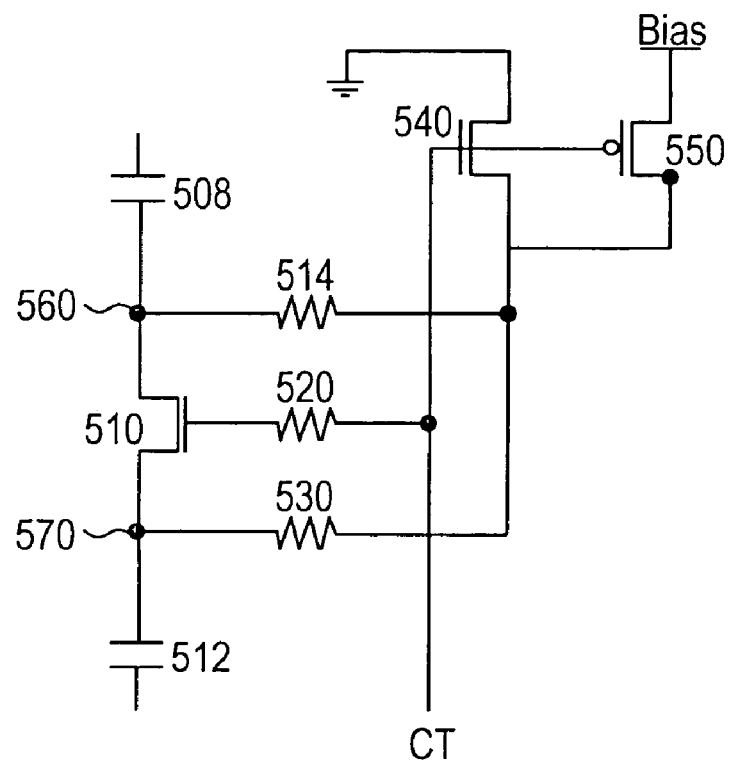
FIG. 5B illustrates one embodiment for reducing parasitic capacitance for a capacitor bank.

FIG. 5B illustrates one embodiment for reducing parasitic capacitance for a capacitor bank. An example of a capacitor bank includes capacitors 508 and 512 selectively coupled by MOS transistor (e.g., NMOS) 510. To minimize the parasitic capacitance, the circuit of FIG. 5B includes transistors 540 and 550. A control signal (CT) is used to select capacitors (508 and 512) to configure a capacitor bank. The control signal (CT) is input to the gates of transistors 540 and 550 as well as the gate of transistor 510 through resistor 520. Transistor 540, when turned on, couples node 560, through resistor 514, to ground. As shown in FIG. 5B, node 560 is located at a point connecting transistor 510 and capacitor 508. Also, transistor 550 connects, when activated by CT, node 570 to ground through resistor 530. Although the circuit shown in FIG. 5B may be used to selectively couple two capacitors, the circuit may be duplicated to selectively couple any number of capacitors without deviating from the spirit and scope of the invention.

In operation, to connect capacitors 508 and 512, CT is set to a high logic level. A high logic level on CT turns on transistor 510 to couple capacitors 508 and 512. Also, a high logic level on CT turns transistor 540 on and transistor 550 off. Therefore, transistor 540 lowers the voltage at nodes 560 and 570 by pulling the voltage toward ground through resistors 514 and 530, respectively. In this state (i.e., transistor 510 is turned on), the voltage at nodes 560 and 570 properly bias the transistor. To de-couple capacitors 508 and 512, the CT signal is set to a low logic level. As a result, transistors 540 and 510 are turned off, and transistor 550 is turned on. The activated transistor 550 increases the voltage at nodes 560 and 570 based on resistors 514 and 530 and the bias voltage at transistor 550. Also, a low logic level on CT grounds the voltage at the gate of transistor 510. The increased gate to source voltage of transistor 510, a result of the voltage at the source (i.e., node 570) and the voltage at the gate, reduces the gate-source junction capacitance of transistor 510. Similarly, the increased gate to drain voltage of transistor 510, a result of the voltage at the drain (i.e., node 560) and the voltage at the gate, reduces the drain-source junction capacitance of transistor 510. Thus, the circuit minimizes parasitic capacitance generated from the drain to gate and gate to source junctions on the MOS transistors.

Figure 6A:
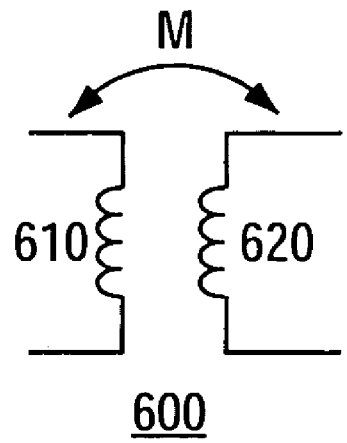
FIG. 6A illustrates an example of an inductor bank.

In one embodiment, the filter characteristics of an inductive bank are improved. Specifically, the bandpass characteristic of an inductor bank is improved by tuning capacitance across inductors based on desired characteristics of the filter (e.g., capacitance is selected to adjust a filter based on tuning frequency of a receiver). FIG. 6A illustrates an example of an inductor bank. As shown in circuit 600 of FIG. 6A, inductors 610 and 620 are configured in parallel. The response of the inductor bank 600 is based on, in part, a mutual coupling factor between inductors 610 and 620. The mutual coupling factor is illustrated in FIG. 6A by the line with arrows and the symbol, M.

Figure 6B:
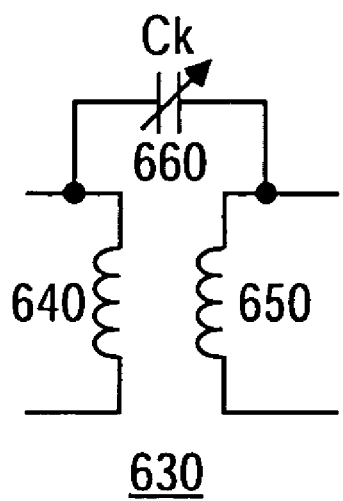
FIG. 6B illustrates an inductor bank configured in accordance with one embodiment of the present invention.

FIG. 6B illustrates an inductor bank configured in accordance with one embodiment of the present invention. For this embodiment, the inductor bank comprises inductors 640 and 650. In addition, the inductor bank 630 comprises variable capacitor 660. The variable capacitor 660 is tunable, such that the capacitance introduced may be varied. The variable capacitor 660 may comprise any type of device capable of generating variable capacitance.

In general, the coupling factor for the inductor bank (e.g., transformer) is controlled by introducing capacitance across the inductors (e.g., variable capacitor 660 in circuit 630 of FIG. 6B). This capacitance is selected based on a tuning frequency of the LC filter. In contrast, the coupling inductor bank 600 of FIG. 6A is based on the inductors' mutual coupling factor. By selecting a capacitance to tune the coupling factor, a constant bandwidth across variable LC filter characteristics (i.e., center frequencies) may be achieved.

Figure 7:
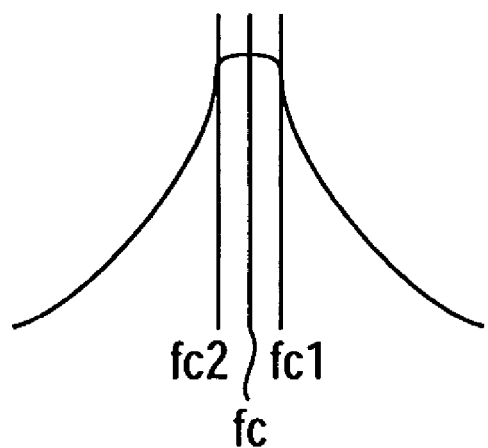
FIG. 7 illustrates a frequency response for an example of an LC filter.
Figure 8:
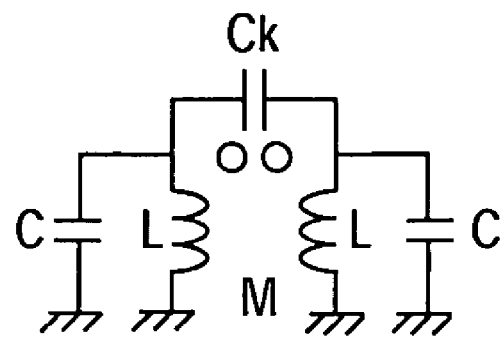
FIG. 8 illustrates an example of an LC filter.

FIG. 7 illustrates a frequency response for an example LC filter. For purposes of nomenclature, the bandpass response is characterized by a center frequencies $f_c$, $f_{c1}$ and $f_{c2}$. FIG. 8 illustrates an example of a LC filter. The following terms are used to define various relationships in the LC filter:

BW—Bandwidth
$k_c$—Capacitive coupling
$k_l$—Inductive coupling
M—Mutual inductance The center frequency, fc, may be defined in accordance with the expression:

$$fc = \sqrt{fc1 * fc2}.$$

The relationship between the frequencies fc1 and fc2 is based on the bandwidth of the response such that:

$$fc1 = BW + fc2.$$

The capacitive coupling factor may be expressed as:

$$kc = \frac{Ck}{C},$$

and the inductive coupling factor may be expressed as:

$$kl = \frac{M}{L}$$

wherein, "C" and "L" are the capacitances and inductances shown in FIG. 7. The total coupling factor may be expressed as a sum of the capacitive and inductive coupling:

$$k = kc + kl.$$

The total coupling factor may be expressed as a function of the fc1 and fc2 frequencies:

$$k = \frac{\left(\frac{fc1}{fc2}\right)^2 - 1}{\left(\frac{fc1}{fc2}\right)^2 + 1}$$

Accordingly, the center frequency range (i.e., fc1 to fc2) of the bandpass response of the LC filter is tunable based, in part, on the value of the capacitive coupling factor.

Although the present invention has been described in terms of specific exemplary embodiments, it will be appreciated that various modifications and alterations might be made by those skilled in the art without departing from the spirit and scope of the invention.

What is claimed is:

1. A tunable discrete inductive filter bank comprising:
   a plurality of inductors, configured essentially in parallel, to form an inductive filter bank for receiving input signals having a plurality of different channels for filtering and for inductive coupling said input signals across said inductors, said inductive filter bank for tuning to one of said plurality of different channels; and
   at least one device for generating a variable coupling factor across at least two inductors of said inductive filter bank, the coupling factor being based on the tuned channel of said inductive filter bank.

2. The tunable discrete inductive filter bank as set forth in claim 1, wherein said device for generating a coupling factor comprises a variable capacitor.

3. The tunable discrete inductive filter bank as set forth in claim 1, wherein a filter response for said tunable discrete inductive filter bank comprises a bandpass filter response.

4. The tunable discrete inductive filter bank as set forth in claim 1, wherein said coupling factor comprises an inductive coupling factor or a capacitive coupling factor.

5. The tunable discrete inductive filter bank as set forth in claim 1, wherein frequency fc1 and a frequency fc2 define a bandwidth of said tuned channel of said inductive filter bank, wherein said coupling factor, expressed as k, comprises the relationship:

$$k = \frac{\left(\frac{fc1}{fc2}\right)^2 - 1}{\left(\frac{fc1}{fc2}\right)^2 + 1}.$$

6. The tunable discrete inductive filter bank as set forth in claim 1, wherein the at least one device comprises:
   a first device coupled with a first end of said plurality of inductors for generating a first variable coupling factor across said inductive filter bank; and
   a second device coupled with a second end of said plurality of inductors for generating a second variable coupling factor across said inductive filter bank.

7. The tunable discrete inductive filter bank as set forth in claim 1, wherein a first end of the at least one device is coupled with a first inductor and a second end of the at least one device is coupled with a second inductor in the inductive filter bank.

8. A tunable discrete inductive-capacitive ("LC") filter comprising:
   inductor bank for receiving an input signal for filtering, said inductor bank comprising:
      a plurality of inductors, configured essentially in parallel, to form an inductive filter bank for receiving input signals having a plurality of different channels for filtering and for inductive coupling said input signals across said inductors, said inductors of said inductive filter bank being selectable in different combinations for tuning to one of said plurality of different channels; and
   at least one device for generating a variable coupling factor across at least two inductors of said inductive filter bank, the coupling factor being based on the tuned channel produced by a particular combination of selected inductors of said inductive filter bank; and
   capacitive bank, comprising a plurality of capacitors, for filtering said input signal.

9. The tunable discrete inductive-capacitive ("LC") filter as set forth in claim 8, wherein said device for generating a coupling factor comprises a variable capacitor.

10. The tunable discrete inductive-capacitive ("LC") filter as set forth in claim 8, wherein a filter response for said LC filter bank comprises a bandpass filter response.

11. The tunable discrete inductive-capacitive ("LC") filter as set forth in claim 8, wherein said coupling factor comprises an inductive coupling factor or a capacitive coupling factor.

12. The tunable discrete inductive-capacitive ("LC") filter as set forth in claim 8, wherein frequency fc1 and frequency fc2 define a bandwidth of said tuned channel of said inductive filter bank, wherein said coupling factor, expressed as k, comprises the relationship:

$$k = \frac{\left(\frac{fc1}{fc2}\right)^2 - 1}{\left(\frac{fc1}{fc2}\right)^2 + 1}.$$

13. The tunable discrete inductive-capacitive ("LC") filter as set forth in claim 8, wherein the at least one device comprises:
   a first device coupled with a first end of said plurality of inductors for generating a first variable coupling factor across said inductive filter bank; and
   a second device coupled with a second end of said plurality of inductors for generating a second variable coupling factor across said inductive filter bank.

14. The tunable discrete inductive-capacitive ("LC") filter as set forth in claim 8, wherein a first end of the at least one device is coupled with a first inductor and a filter bank.

15. A television tuner comprising:
   an input for receiving a television input signals for processing, said television input signals having a plurality of different channels ranging in frequency from 50MHz to 880MHz; and
   tunable inductive-capacitive ("LC") filter comprising:
      inductor bank for receiving an input signal for filtering, said inductor bank comprising:
         a plurality of inductors, configured essentially in parallel, to form an inductive filter bank for receiving television input signals for filtering and for inductive coupling said television input signals across said inductors, said inductive filter bank for tuning to one of said plurality of different channels; and
         at least one device for generating a variable coupling factor across at least two inductors of said inductive filter bank, the coupling factor being based on the tuned channel of said inductive filter bank; and
      capacitive bank, comprising a plurality of capacitors, for filtering said television input signals.

16. The television tuner as set forth in claim 15, wherein said device for generating a coupling factor comprises a variable capacitor.

17. The television tuner as set forth in claim 15, wherein a filter response for said LC filter comprises a bandpass filter response.

18. The television tuner as set forth in claim 15, wherein said coupling factor comprises an inductive coupling factor or a capacitive coupling factor.

19. The television tuner as set forth in claim 15, wherein frequency fc1 and frequency fc2 define a bandwidth of said tuned channel of said inductive filter bank, and wherein said coupling factor, expressed as k, comprises the relationship:

$$k = \frac{\left(\frac{fc1}{fc2}\right)^2 - 1}{\left(\frac{fc1}{fc2}\right)^2 + 1}.$$

20. The television tuner as set forth in claim 15, wherein the at least one device comprises:

a first device coupled with a first end of said plurality of inductors for generating a first variable coupling factor across said inductive filter bank; and a second device coupled with a second end of said plurality of inductors for generating a second variable coupling factor across said inductive filter bank.

21. The television tuner as set forth in claim 15, wherein a first end of the at least one device is coupled with a first inductor and a second end of the at least one device is coupled with a second inductor in the inductive filter bank.

* * * * *